US012389808B2

(12) United States Patent
Lin

(10) Patent No.: US 12,389,808 B2
(45) Date of Patent: Aug. 12, 2025

(54) SEMICONDUCTOR DEVICE AND METHOD FOR FABRICATING THE SAME

(71) Applicant: UNITED MICROELECTRONICS CORP., Hsin-Chu (TW)

(72) Inventor: Hung-Chan Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 50 days.

(21) Appl. No.: 17/723,495

(22) Filed: Apr. 19, 2022

(65) Prior Publication Data

US 2023/0320232 A1 Oct. 5, 2023

(30) Foreign Application Priority Data

Mar. 24, 2022 (CN) .......................... 202210298345.4

(51) Int. Cl.
*H10N 52/01* (2023.01)
*H10B 61/00* (2023.01)
*H10N 52/00* (2023.01)
*H10N 52/80* (2023.01)

(52) U.S. Cl.
CPC ............. *H10N 52/01* (2023.02); *H10B 61/00* (2023.02); *H10N 52/00* (2023.02); *H10N 52/80* (2023.02)

(58) Field of Classification Search
CPC ........ H10N 52/01; H10N 52/00; H10N 52/80; H10B 61/00
See application file for complete search history.

(56) References Cited

U.S. PATENT DOCUMENTS

| 9,230,626 B2 | 1/2016 | Buhrman et al. | |
| 2019/0013354 A1* | 1/2019 | Lee | G11C 11/161 |
| 2020/0006631 A1* | 1/2020 | Sato | G11C 11/161 |
| 2020/0227104 A1* | 7/2020 | Rahman | H10B 61/22 |
| 2020/0227626 A1* | 7/2020 | Lee | H10N 50/80 |
| 2021/0098693 A1* | 4/2021 | Chuang | H10N 50/01 |

FOREIGN PATENT DOCUMENTS

TW 202118101 A 5/2021

* cited by examiner

*Primary Examiner* — Latanya N Crawford Eason
(74) *Attorney, Agent, or Firm* — Winston Hsu

(57) ABSTRACT

A method for fabricating semiconductor device includes the steps of forming a first inter-metal dielectric (IMD) layer, forming two via holes and a trench in the first IMD layer, forming a metal layer in the two via holes and the trench for forming a metal interconnection and a spin orbit torque (SOT) layer, forming a magnetic tunneling junction (MTJ) on the SOT layer, forming a first hard mask on the MTJ, forming a second hard mask on the first hard mask, forming a cap layer adjacent to the MTJ, and forming a second IMD layer around the cap layer.

13 Claims, 6 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method for fabricating magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of forming a first inter-metal dielectric (IMD) layer, forming two via holes and a trench in the first IMD layer, forming a metal layer in the two via holes and the trench for forming a metal interconnection and a spin orbit torque (SOT) layer, forming a magnetic tunneling junction (MTJ) on the SOT layer, forming a first hard mask on the MTJ, forming a second hard mask on the first hard mask, forming a cap layer adjacent to the MTJ, and forming a second IMD layer around the cap layer.

According to another aspect of the present invention, a semiconductor device includes a first inter-metal dielectric (IMID) layer on a substrate and a metal interconnection and a spin orbit torque (SOT) layer in the first IMD layer. Preferably, top surfaces of the first IMD layer and the SOT layer are coplanar.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
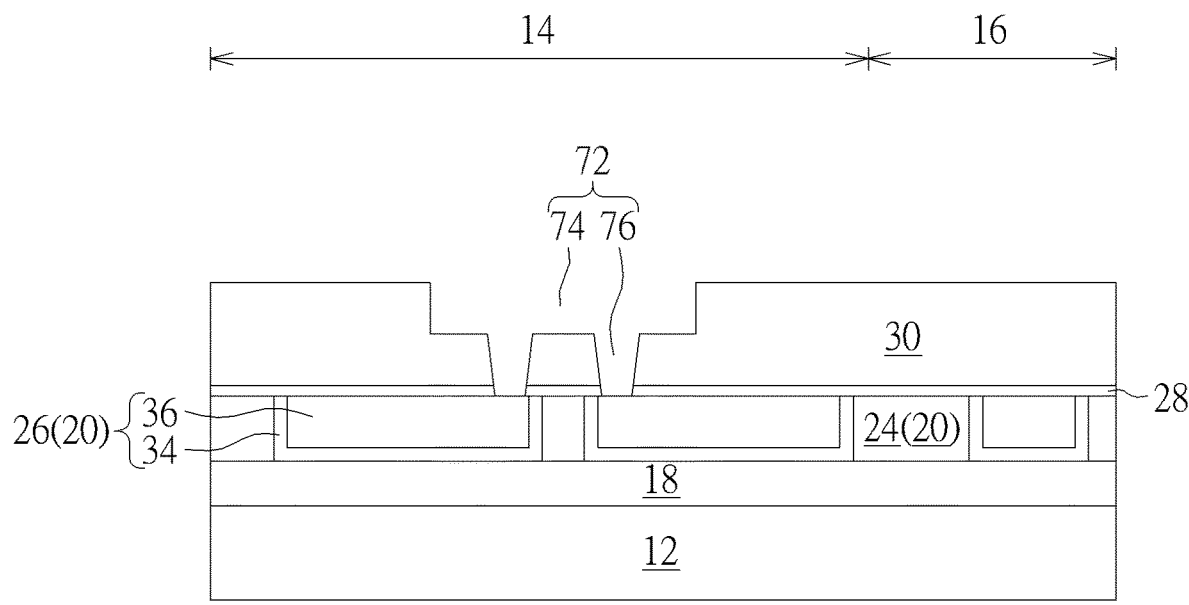
FIGS. 1-8 illustrate a method for fabricating a MRAM device according to an embodiment of the present invention.

Referring to FIGS. 1-8, FIGS. 1-8 illustrate a method for fabricating a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, a metal interconnect structure 20 is formed on the ILD layer 18 to electrically connect the aforementioned contact plugs, in which the metal interconnect structure 20 includes an inter-metal dielectric (IMD) layer 24 and metal interconnections 26 embedded in the IMD layer 24. In this embodiment, each of the metal interconnections 26 from the metal interconnect structure 20 preferably includes a trench conductor, in which each of the metal interconnections 26 could be embedded within the IMD layer 24 according to a single damascene process or dual damascene process. For instance, each of the metal interconnections 26 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity.

Next, a stop layer 28 and an IMD layer 30 is formed on the metal interconnect structure 20, and one or more etching process is conducted by using a patterned mask (not shown) to remove part of the IMD layer 30 and part of the stop layer 28 for forming an opening 72 exposing the metal interconnection 26 underneath. Preferably, the opening 72 includes a trench 74 or trench opening and two via holes 76 connecting to the bottom of the trench 74.

Figure 2:
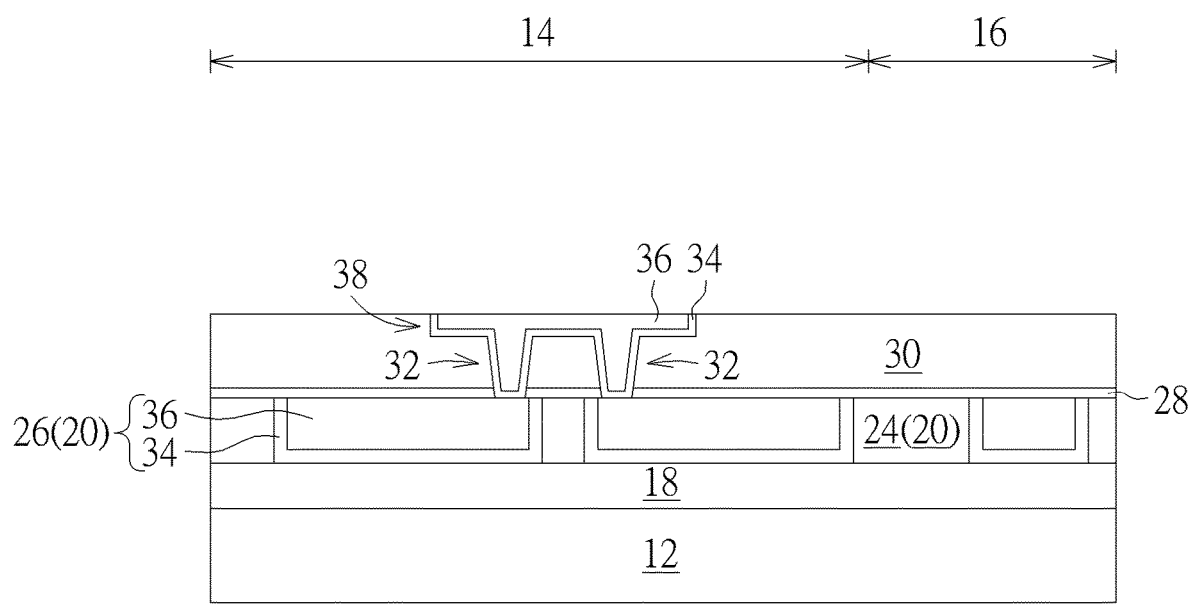

Next, as shown in FIG. 2, a barrier layer 34 and a metal layer 36 is formed to fill the opening 72 completely, and a planarizing process such as chemical mechanical polishing (CMP) process is conducted to remove part of the metal layer 36, part of the barrier layer 34, and part of the IMD layer 30 so that the top surfaces of the remaining barrier layer 34, metal layer 36, and IMD layer 30 are coplanar. It should be noted that the planarized barrier layer 34 and metal layer 36 together constitute a metal interconnection 32 and a spin orbit torque (SOT) layer 38 serving as a channel for SOT MRAM in the opening 72, in which the barrier layer 34 and metal layer 36 filled in the lower two via holes 76 become the metal interconnection 32 made of via conductors while the barrier layer 34 and metal layer 36 filled in the trench 74 opening become the SOT layer 38.

Similar to the aforementioned embodiment, the barrier layer 34 from the metal interconnection 32 and SOT layer 38 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). In this embodiment, the metal layer 36 in the metal interconnection 32 and SOT layer 38 is preferably made of tungsten (W) and the stop layer 28 is preferably made of nitrogen doped carbide (NDC), silicon nitride, silicon carbon nitride (SiCN), or combination thereof.

Figure 3:
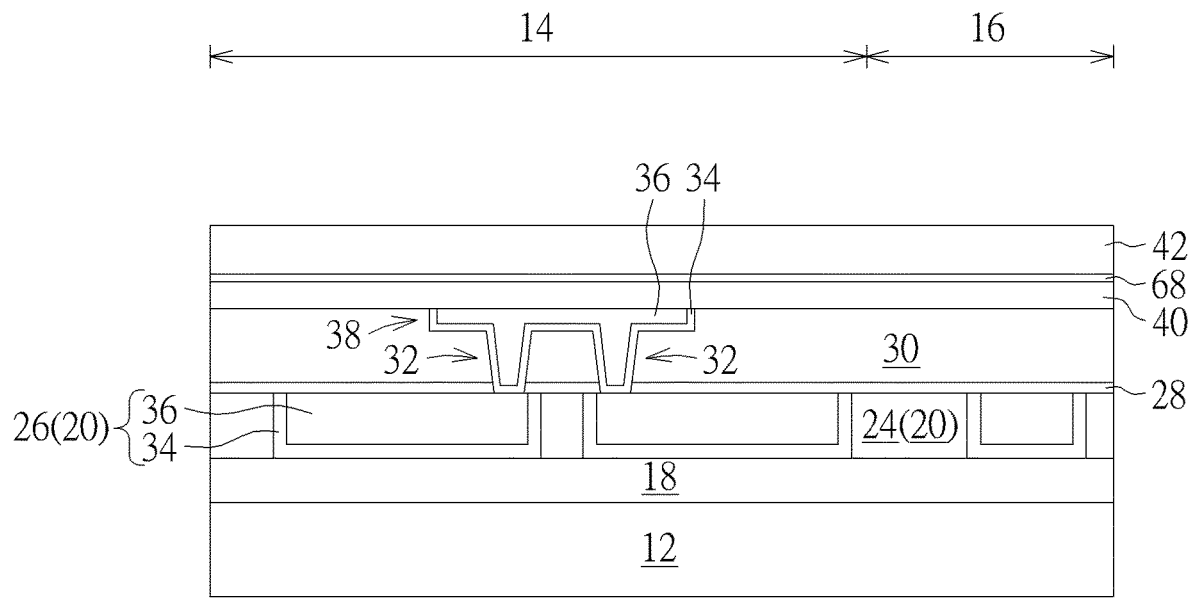

Next, as shown in FIG. 3, a MTJ stack 40 or stack structure, a hard mask 68, and another hard mask 42 are formed on the SOT layer 38. In this embodiment, the formation of the MTJ stack 40 could be accomplished by sequentially depositing a pinned layer, a barrier layer, and a free layer on the SOT layer 38. Preferably, the pinned layer could be made of ferromagnetic material including but not limited to for example iron, cobalt, nickel, or alloys thereof such as cobalt-iron-boron (CoFeB) or cobalt-iron (CoFe). Alternatively, the pinned layer could also be made of antiferromagnetic (AFM) material including but not limited to for example ferromanganese (FeMn), platinum manganese (PtMn), iridium manganese (IrMn), nickel oxide (NiO), or combination thereof, in which the pinned layer is formed to fix or limit the direction of magnetic moment of adjacent layers. The barrier layer could be made of insulating material including but not limited to for example oxides such as aluminum oxide ($AlO_x$) or magnesium oxide (MgO). The free layer could be made of ferromagnetic material including but not limited to for example iron, cobalt, nickel, or alloys thereof such as cobalt-iron-boron (CoFeB), in which the magnetized direction of the free layer could be altered freely depending on the influence of outside magnetic field.

Preferably, the hard mask 68 includes conductive material or metal such as ruthenium (Ru) and the hard mask 42 preferably includes conductive or dielectric material such as tantalum (Ta), tantalum nitride (TaN), titanium (Ti), titanium nitride (TiN), platinum (Pt), copper (Cu), gold (Au), aluminum (Al), or combination thereof.

Figure 4:
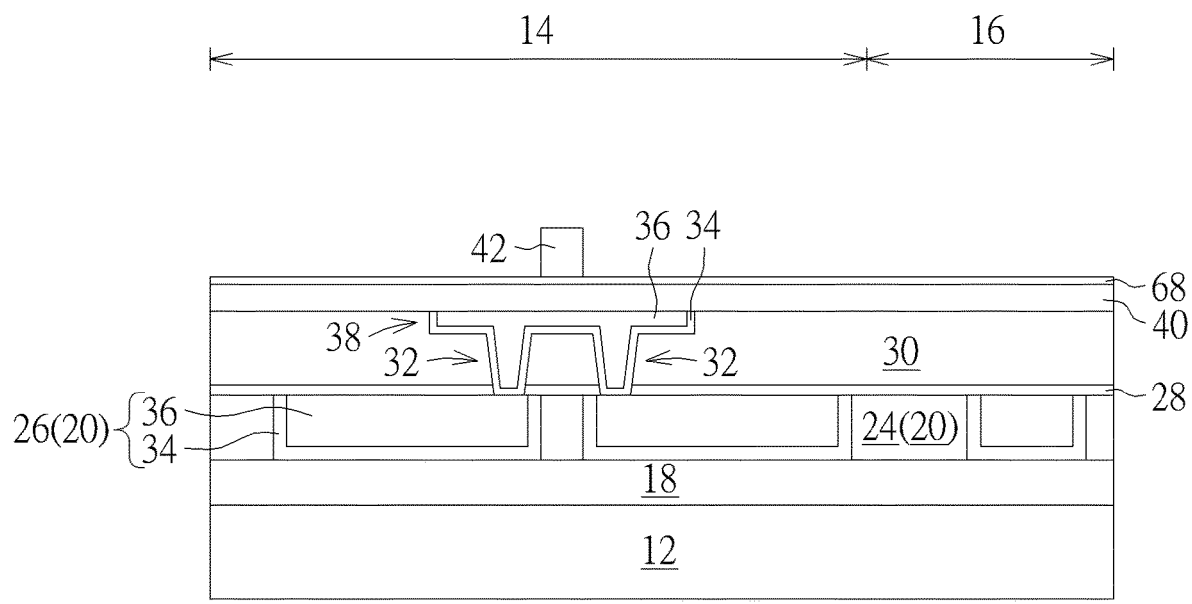

Next, as shown in FIG. 4, an etching process or more specifically a photo-etching process is conducted to pattern the hard mask 42 for exposing the surface of the hard mask 68 underneath. Specifically, the photo-etching process could be accomplished by first forming a patterned mask (not shown) such as patterned resist on the hard mask 42, and then an etching process is conducted by using the patterned mask to remove part of the hard mask 42 for forming a patterned hard mask 42 and exposing the surface of the hard mask 68. Preferably, the etching process conducted at this stage includes a reactive ion etching (RIE) process.

Figure 5:
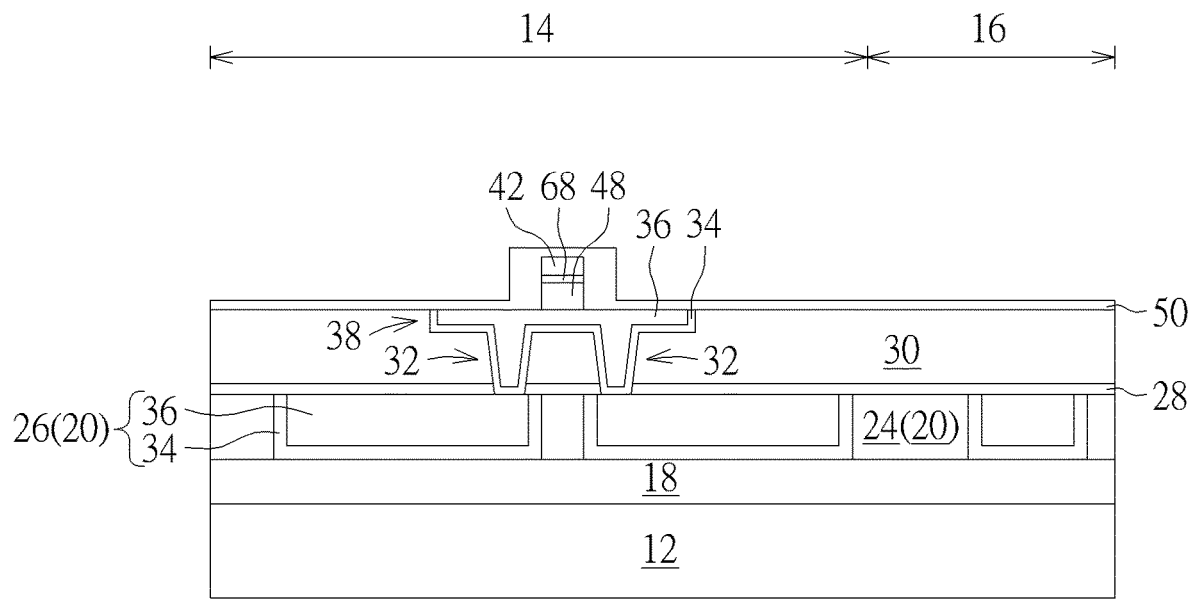

Next, as shown in FIG. 5, one or more etching process such as an ion beam etching (IBE) process is conducted to remove part of the hard mask 68 and part of the MTJ stack 40 to form a MTJ 48 on the MRAM region 14. Preferably, part of the hard mask 42 may be consumed during the etching process so that the overall thickness of the hard mask 42 could be slightly reduced. Next, a cap layer 50 is formed on the MTJ 48 to cover the surface of the IMD layer 30 on the MRAM region 14 and logic region 16. In this embodiment, the cap layer 50 preferably includes silicon nitride (SiN), but could also include other dielectric material including but not limited to for example silicon oxide, silicon oxynitride (SiON), or silicon carbon nitride (SiCN).

Next, an etching process could be conducted without forming any patterned mask to remove part of the cap layer 50 so that the cap layer 50 directly contacting the top surface of the hard mask 42 and the cap layer 50 directly contacting the top surface of the SOT layer 38 have same thickness while the cap layer 50 directly contacting the top surface of the SOT layer 38 and the cap layer 50 directly contacting the sidewall of the MTJ 48 have different thicknesses, or more specifically the thickness the cap layer 50 directly contacting the top surface of the SOT layer 38 is less than the thickness of the cap layer 50 directly contacting the sidewall of the MTJ 48. In this embodiment, the thickness of the cap layer 50 adjacent to or directly contacting sidewall of the MTJ 48 is approximately twice or more such as three or even four times the thickness of the cap layer 50 on top or directly contacting the top surface of the SOT layer 38.

Figure 6:
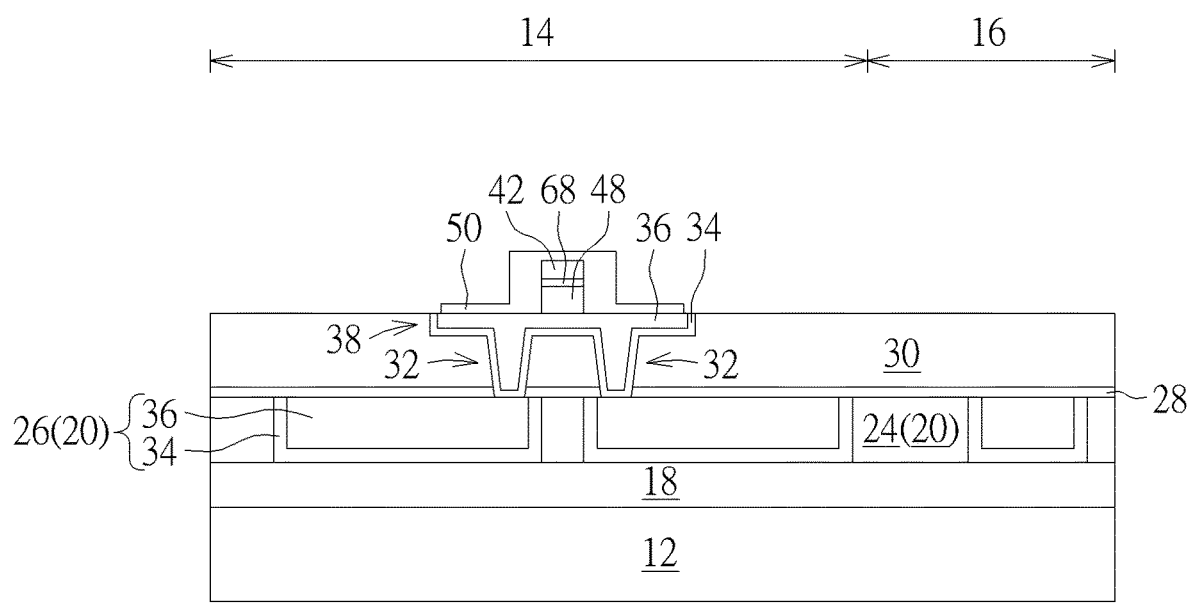

Next, as shown in FIG. 6, a photo-etching process is conducted to pattern the cap layer 50 by using a patterned mask (not shown) such as a patterned resist as mask to remove part of the cap layer 50 through etching process and expose the top surface of the IMD layer 30, in which the sidewall of the patterned cap layer 50 could be aligned with or not aligned with the sidewall of the SOT layer 38 underneath. If the sidewall of the patterned cap layer 50 were not aligned with the sidewall of the SOT layer 38, the sidewall of the cap layer 50 could be overlapping or not overlapping the SOT layer 38. For instance, if the cap layer 50 were formed to extend outward as the width of the cap layer 50 is greater than the width of the SOT layer 38, the bottom surface of the cap layer 50 would contact the top surface of the SOT layer 38 and the IMD layer 30 at the same time. Alternatively, if the cap layer 50 were formed to slightly shrink inward as the width of the cap layer 50 is less than the width of the SOT layer 38, the bottom surface of the cap layer 50 would only contact the top surface of the SOT layer 38 directly but not contacting the top surface of the IMD layer 30, which are all within the scope of the present invention.

Figure 7:
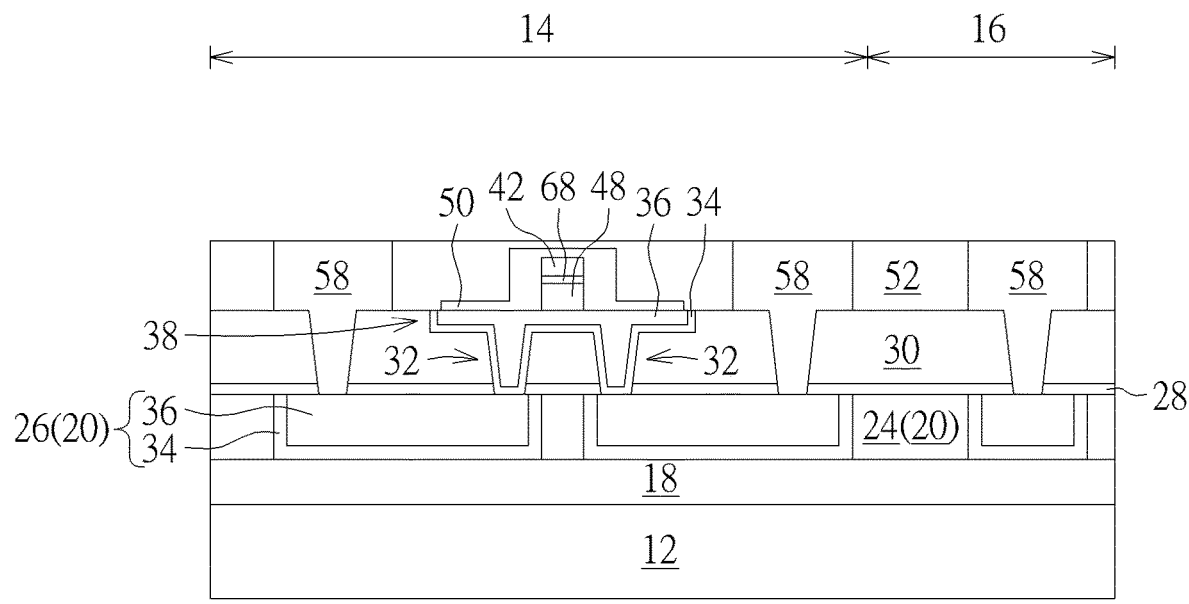

Next, as shown in FIG. 7, an atomic layer deposition (ALD) process is conducted to from an ID layer 52 on the cap layer 50 and the IMD layer 30, in which the ID layer 52 could include an ultra low-k (ULK) dielectric layer including but not limited to for example porous material or silicon oxycarbide (SiOC) or carbon doped silicon oxide (SiOCH).

Next, a planarizing process such as chemical mechanical polishing (CMP) process or etching back process is conducted to remove part of the IMD layer 52 so that the top surface of the remaining IMD layer 52 includes a planar surface and is still higher than the top surface of the cap layer 50. Next, a pattern transfer process is conducted by using a patterned mask (not shown) to remove part of the ID layer 52, part of the IMD layer 30, and part of the stop layer 28 on the MRAM region 14 and logic region 16 to form contact holes (not shown) exposing the metal interconnections 26 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact holes, and a planarizing process such as CMP could be conducted to remove part of the conductive materials including the aforementioned barrier layer and metal layer to form metal interconnections 58 in the contact holes electrically connecting the metal interconnections 26. It should be noted that each of the metal interconnections 58 could include a trench conductor disposed in the IMD layer 52 and via conductor disposed in the IMD layer 30, in which the bottom surface of the trench conductor or top surface of the via conductor is even with the top surface of the SOT layer 38 or bottom surface of the MTJ 48.

Figure 8:
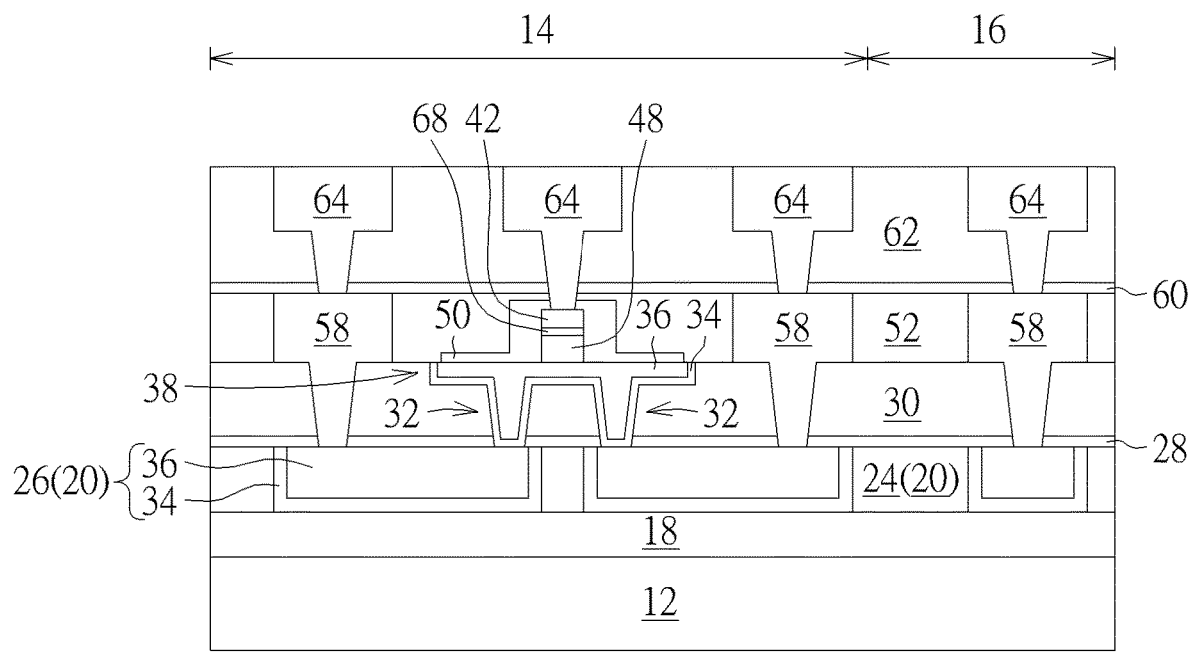

Next, as shown in FIG. 8, a stop layer 60 is formed on the MRAM region 14 and logic region 16 to cover the IMD layer 52 and metal interconnections 58, an IMD layer 62 is formed on the stop layer 60, and one or more photo-etching process is conducted to remove part of the IMD layer 62, part of the stop layer 60, part of the IMD layer 52, and part of the cap layer 50 on the MRAM region 14 and logic region 16 to form contact holes (not shown). Next, conductive materials are deposited into each of the contact holes and a planarizing process such as CMP is conducted to form metal interconnections 64 connecting the MTJ 48 and metal interconnections 58 underneath, in which the metal interconnections 64 on the MRAM region 14 directly contact the hard mask 42 and metal interconnections 58 underneath while the metal interconnections 64 on the logic region 16 directly contacts the metal interconnections 58 on the lower level.

In this embodiment, the stop layers 60 and 28 could be made of same or different materials, in which the two layers 60, 28 could all include nitrogen doped carbide (NDC), silicon nitride, silicon carbon nitride (SiCN), or combination thereof. Similar to the metal interconnections formed previously, each of the metal interconnections 64 could be formed in the IMD layer 62 through a single damascene or dual damascene process. For instance, each of the metal interconnections 64 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Figure 9:
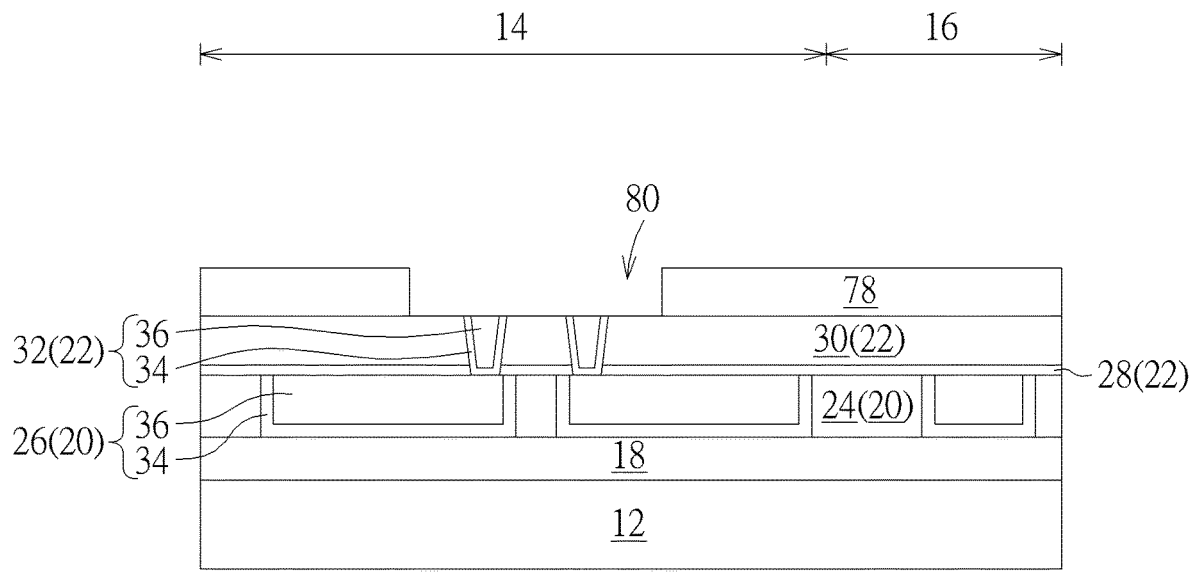
FIGS. 9-11 illustrate a method for fabricating a MRAM device according to an embodiment of the present invention.
Figure 10:
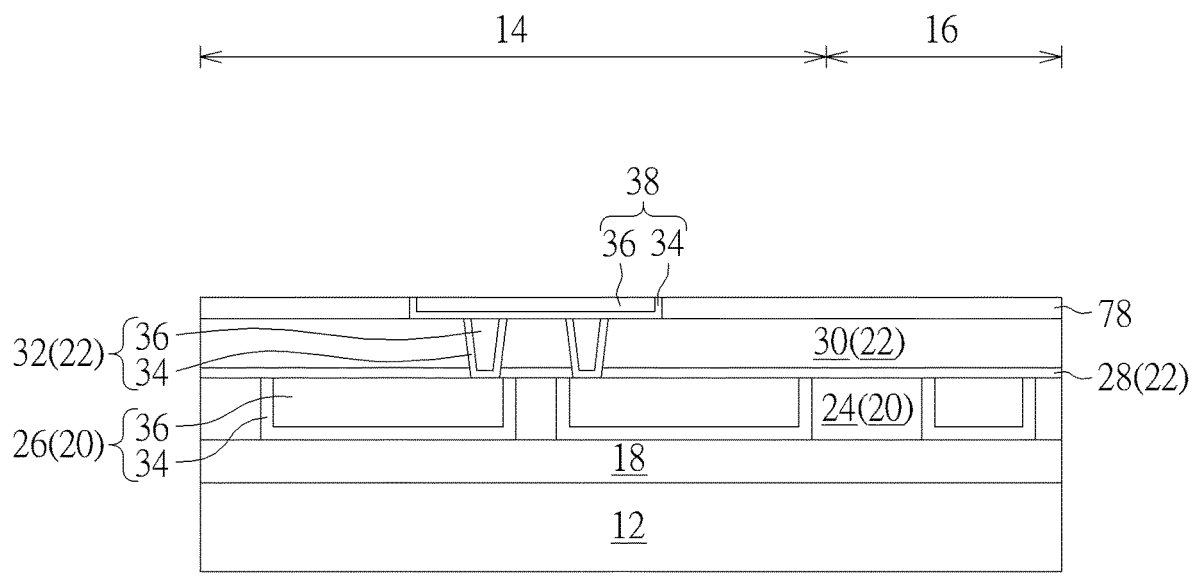
Figure 11:
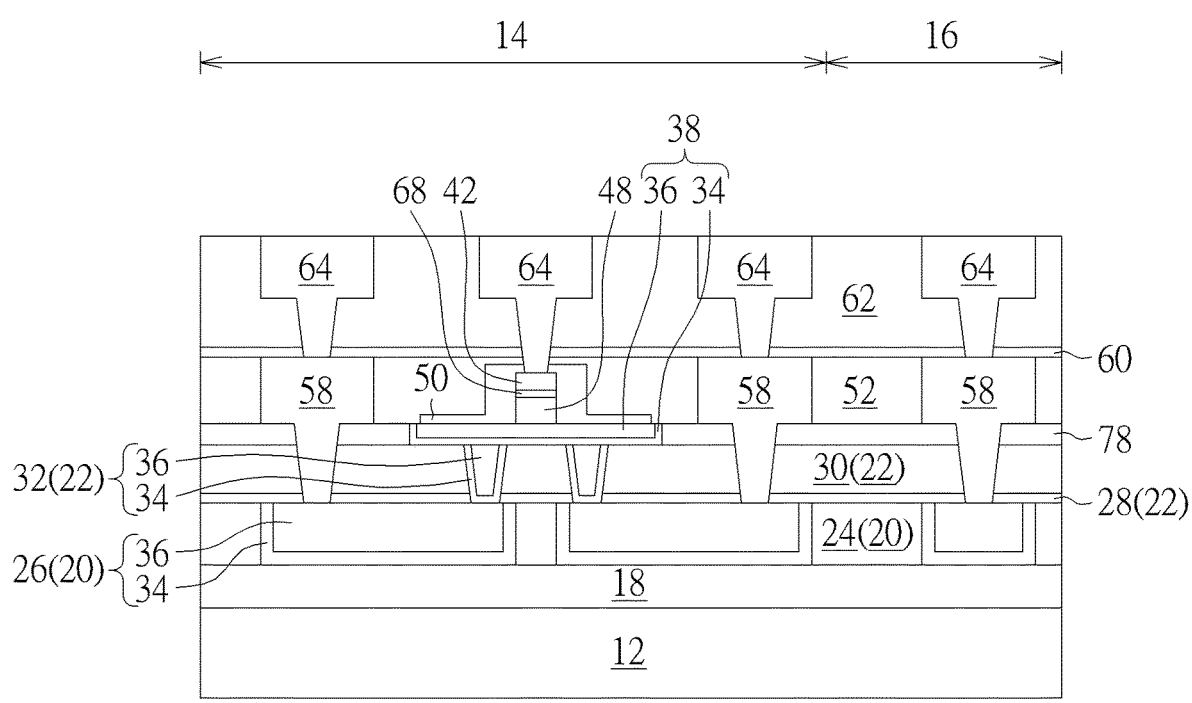

Referring to FIGS. 9-11, FIGS. 9-11 illustrate a method for fabricating a MRAM device according to an embodiment of the present invention. As shown in FIG. 9, it would be desirable to first follow the process conducted in FIG. 1 by forming an IMD layer 18 on a substrate 12 and then forming metal interconnect structures 20, 22 to electrically connect the contact plugs in the IMD layer 18, in which the metal interconnect structure 20 includes an IMD layer 24 and metal interconnections 26 embedded in the IMD layer 24 while the metal interconnect structure 22 includes a stop layer 28, an IMD layer 30, and at least two metal interconnections 32 embedded in the stop layer 28 and the IMD layer 30.

In this embodiment, each of the metal interconnections 26 from the metal interconnect structure 20 preferably includes a trench conductor and the metal interconnection 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 in the metal interconnections 26 are preferably made of copper, the metal layer 36 in the metal interconnections 32 is made of tungsten, the IMD layers 24, 30 are preferably made of silicon oxide such as tetraethyl orthosilicate (TEOS), and the stop layer 28 is preferably made of nitrogen doped carbide (NDC), silicon nitride, silicon carbon nitride (SiCN), or combination thereof. Next, another IMD layer 78 is formed on the metal interconnect structure 22, and a photo-etching process is conducted to remove part of the IMD layer 78 for forming an opening 80 or trench exposing the metal interconnection 32 underneath.

Next, as shown in FIG. 10, a barrier layer 34 and a metal layer 36 are formed to fill the opening 80 completely, and then a planarizing process such as CMP is conducted to remove part of the barrier layer 34, part of the metal layer 36, and part of the IMD layer 78 so that the top surfaces of the remaining barrier layer 34 and metal layer 36 are even with the top surface of the IMD layer 78 to form a SOT layer 38 in the opening 80.

Similar to the aforementioned embodiment, the SOT layer 38 preferably serves a channel for the SOT MRAM device as the barrier layer could be selected from the group consisting of titanium (Ti), titanium nitride (TiN), tantalum (Ta), and tantalum nitride (TaN) and the metal layer 36 could include tantalum (Ta), tungsten (W), platinum (Pt), or hafnium (Hf) and/or topological insulator such as bismuth selenide ($Bi_xSe_{1-x}$). It should be noted that in contrast to the metal layer 36 in the metal interconnection 32 and the metal layer 36 in the SOT layer 38 from the aforementioned embodiment are made of same material such as tungsten, the metal layer 36 in the metal interconnection 32 and the metal layer 36 in the SOT layer 38 in this embodiment could be made of same or different material depending on the demand of the product. In this embodiment, the metal layers 36 from the metal interconnection 32 and SOT layer 38 are both made of tungsten and the IMD layers 24, 30, 78 are made of silicon oxide such as TEOS, but not limited thereto.

Next, as shown in FIG. 11, processes conducted in FIGS. 3-8 could then be carried out to form a MTJ stack 40, a hard mask 68, and another hard mask 42 on the SOT layer 38, pattern the hard mask 42, the hard mask 68, and the MTJ stack 40 to form a MTJ 48, form a cap layer 50 on the MTJ 48, pattern the cap layer 50 so that the edge of the cap layer 50 could be aligned or not aligned with sidewall of the SOT layer 38 underneath, form an IMD layer 52 on the cap layer 50, form metal interconnections 58 in the IMD layers 52, 78, 30 to connect to the metal interconnections 26, form a stop layer 60 and IMD layer 62 on the IMD layer 52, and then form metal interconnections 64 in the IMD layer 62 to electrically connect the MTJ 48 and metal interconnections 58, in which the metal interconnection 64 on the MRAM region 14 directly contacts the hard mask 42 underneath while the metal interconnection 64 on the logic region 16 contacts the lower level metal interconnection 58.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
    forming a first inter-metal dielectric (IMD) layer on a substrate;
    forming two via holes and a trench in the first IMD layer; and
    forming a single barrier layer and a single metal layer in the two via holes and the trench for forming a metal interconnection and a spin orbit torque (SOT) layer at the same time in the two via holes and the trench, wherein a topmost surface of the SOT layer is even with a top surface of the first IMD layer.

2. The method of claim 1, further comprising:
    forming a magnetic tunneling junction (MTJ) on the SOT layer;
    forming a first hard mask on the MTJ;
    forming a second hard mask on the first hard mask;
    forming a cap layer adjacent to the MTJ; and
    forming a second IMD layer around the cap layer.

3. The method of claim 2, further comprising forming the cap layer on the SOT layer.

4. The method of claim 2, further comprising forming the second IMD layer on the SOT layer.

5. The method of claim 2, wherein top surfaces of the first IMD layer and the SOT layer are coplanar.

6. The method of claim 2, wherein the first hard mask comprises ruthenium (Ru).

7. The method of claim 2, wherein the second hard mask comprises metal nitride.

8. The method of claim 1, wherein the metal interconnection and the SOT layer comprise same material.

9. The method of claim 1, wherein the metal interconnection and the SOT layer comprises tungsten.

10. A semiconductor device, comprising:
    a first inter-metal dielectric (IMID) layer on a substrate;
    a second IMD layer on the first IMD layer;
    a metal interconnection in the second IMD layer;
    a third IMD layer on the second IMD layer;
    a spin orbit torque (SOT) layer in the third IMD layer, wherein each of the metal interconnection and the SOT layer is made of a single barrier layer and a single metal layer and a topmost surface of the SOT layer is even with a top surface of the third IMD layer;
    a magnetic tunneling junction (MTJ) on the SOT layer;
    a first hard mask on the MTJ;
    a second hard mask on the first hard mask;
    a cap layer adjacent to the MTJ; and
    a fourth IMD layer around the cap layer.

11. The semiconductor device of claim 10, wherein bottom surfaces of the third IMD layer and the SOT layer are coplanar.

12. The semiconductor device of claim 10, wherein the metal interconnection and the SOT layer comprise same material.

13. The semiconductor device of claim 10, wherein the metal interconnection and the SOT layer comprises tungsten.

* * * * *